United States Patent [19]

Ogden et al.

[11] Patent Number: 4,731,754
[45] Date of Patent: Mar. 15, 1988

[54] ERASABLE OPTICAL MEMORY MATERIAL FROM A FERROELECTRIC POLYMER

[75] Inventors: T. Roger Ogden; Debra M. Gookin, both of San Diego, Calif.

[73] Assignee: The United States of America as represented by the Secretary of the Navy, Washington, D.C.

[21] Appl. No.: 775,541

[22] Filed: Sep. 12, 1985

[51] Int. Cl.⁴ .................. G11C 11/42; G11C 11/22
[52] U.S. Cl. ......................... 365/121; 365/117
[58] Field of Search ............... 365/109, 117, 120–122; 369/275, 284, 288; 346/150

[56] References Cited

U.S. PATENT DOCUMENTS

| | | | |
|---|---|---|---|
| 3,479,651 | 11/1969 | Bowers | 365/121 X |
| 3,680,060 | 7/1972 | Keneman et al. | 365/117 X |
| 3,829,847 | 8/1974 | Masi | 365/121 X |
| 3,855,579 | 12/1974 | Grenot et al. | 365/121 X |
| 3,868,653 | 2/1975 | Winter | 365/117 |
| 3,902,788 | 9/1975 | Strehlow | 365/121 |

FOREIGN PATENT DOCUMENTS

| | | |
|---|---|---|
| 3418567 | 11/1984 | Fed. Rep. of Germany . |
| 55-126905 | 10/1980 | Japan . |
| 2142494 | 1/1985 | United Kingdom ............. 365/117 |

Primary Examiner—T. H. Tubbesing
Assistant Examiner—Gilberto Barrón, Jr.
Attorney, Agent, or Firm—Robert F. Beers; Ervin F. Johnston; Thomas Glenn Keough

[57] ABSTRACT

An electro-optic memory effect providing for storing, erasing and rewriting digital information relies upon a ferroelectric polymer, polyvinylidene fluoride. Recent development of tri-fluoroethylene copolymers of this material with Curie temperatures below the melting point provides a means of selective writing, storage and erasure. The advantage of the polyvinylidene fluoride material for optical recording is its high chemical and physical stability. This material provides a mechanism for bit-by-bit erasure and long time storage of information.

17 Claims, 4 Drawing Figures

ERASABLE OPTICAL MEMORY MATERIAL FROM A FERROELECTRIC POLYMER

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

Conventional magnetic storage technology is well advanced and a wide variety of magnetic tapes and disks have evolved. Most are erasable and have very long storage lifetimes. However, their information densities and the read/write times, while adequate for some digital systems, have been found to be limiting features when compared to the capabilities and demands of optical data processing systems using optical memory materials.

Nonerasable optical storage devices already are commercially available and have very high storage capacities and very fast read/write times. A relatively new item having found a wide range of usefulness for commercial viewing and archival record storage is the video optical disk that has high enough speeds for real-time color presentations.

Recently interest has focussed on the development of magneto-optical materials for erasable optical recording applications. A. R. Tebo, in his article in *Electro-Optics* 15, Number 5 (1983) 40 discusses device concepts based on the magneto-optic Kerr effect. The Kerr effect results in a rotation of the direction of polarization of a transmitted polarized beam of light depending on the state of magnetic polarization of the material. A large commercial interest has developed concerning this type of erasable optical material and several device schemes are currently under development. Most, if not all of these are based on magneto-optic materials which exhibit a reversible change in optical properties when heated with a focused laser beam. The magneto-optical materials employed rely on a magneto-optic hyseteresis effect. This means that a linearly polarized beam of light has a different direction of polarization after passing through the material, depending on whether the material at that spot has been heated above its Curie temperature in the presence of a magnetic field. While these materials have shown quite promising results with respect to storage densities and read and write times, a principle difficulty has been that, as a group, the magnetic materials tend to be physically and chemically unstable making them unable to hold information for long times.

Electro-optic effects have been observed previously in strain-biased ferroelectric ceramics, see the articles by C. E. Land, *Ferroelectrics* 7 (1974) 45, M. D. Drake, *Applied Optics,* 13 (1974) 347 and by P. J. Chen and C. E. Land *Journal of Applied Physics* 51 (1980) 4961. The electro-optic effects have been used in a variety of erasable memory applications employing electrically controlled scattering, birefringence, and surface deformation. Ferroelectric ceramics, however, are not suitable as digital optical memory materials which require a very thin, optically uniform films for acceptable operation.

Memories in several photoconductor-ferroelectric sandwich shells have been developed in the state-of-the-art. Representative of these are U.S. Pat. Nos. 3,902,788, 3,855,579, 3,680,060 and 3,479,651. These rely upon a photoconductive layer deposited on a ferroelectric layer and a voltage is applied across both. When unilluminated, the photoconductor is very resistive and there is only a small voltage drop across the ferroelectric layer. When illuminated at a spot the photoconductor becomes highly conductive and the ferroelectric experiences a large voltage drop and is poled at that spot. A change in the state of the ferroelectric can be detected from the rotation in the direction of polarization of a transmitted beam of light.

Optically addressable ferroelectric memory effects having refractive index modulations due to migration of photogenerated charge are represented in U.S. Pat. Nos. 3,829,845 and 3,868,653. A voltage is applied across a poled ferroelectric. The material is illuminated at a spot by light at a wavelength which photogenerates free charge in the material. The charge drifts in the direction of the electric field and eventually is retrapped changing the index of refraction of the illuminated point. The shift in index of refraction can be read as a rotation of polarization in a transmitted beam of light. The stored information can be erased by illumination at a point in a reversed electric field or by uniform illumination of the entire sample with no applied voltage.

Thus, there is a continuing need in the state-of-the-art for a ferroelectric polymer system used to optically write and erase information and read optically which relies on the recent development of thin film ferroelectric polymers having low Curie temperatures and which avoids the consequences of conventional ferroelectric ceramics. These temperatures allow a voltage applied across a thin sheet or film of the ferroelectric polymer to have a spot heated with a laser beam to a temperature such that the electric field generated by an applied voltage is sufficient to pole the material. This spot is then considered to contain a bit of information and is readable due to the effects of rotation in direction of polarization of a polarized beam of light passing through the material at that spot. The material is erasable at each spot by selective heating with a laser beam with no applied voltage to depole the material. As a consequence, very high storage densities of digital information may be made. The long term storage, erasability and rewrite capabilities are superior to magneto-optic materials.

SUMMARY OF THE INVENTION

The present invention is directed to providing an apparatus for optically storing, erasing and rewriting digital information and having long term chemical and physical stability. A thin polyvinylidene-fluoride co-polymer film having its Curie temperature below its melting point has a potential connected across it. The electric field impressed across the film is less than its coercive field. A laser writing beam heats a spot so that the coercive field is less than the applied electric field to pole the material at that spot. When the writing beam is removed, the polarization of the spot is stored. A polarized reading beam of less intensity than the writing beam is rotated in accordance with the polarization of the spot and information is retrieved. Optionally, the applied field is removed during reading. Erasure is accomplished by heating the recorded spots above the Curie temperature in the absence of an applied field. Information density is high due to the small spot size and is written, stored or selectively erased or rewritten by a subsequent writing operation.

OBJECTS OF THE INVENTION

A prime object of the invention is to electro-optically write, store and erase information.

Another object is to provide for an optical storage of information in a material having a high chemical and physical stability such as ferroelectric polymers.

Another object is to electro-optically write, store and erase information on a ferroelectric film to assure long term memory.

Still another object is to provide for electro-optically writing, storing and erasing of information in a copolymer polyvinylidene-fluoride film.

Still a further object is to provide for a long term dense storage of information by electro-optically polarizing a copolymer polyvinylidene-fluoride film.

Another object is to use a polyvinylidene-fluoride copolymer film having a Curie temperature below its melting point to assure the erasability of electro-optically written and electro-optically readable information.

Still another object is to provide for a dense storage of information by electro-optical writing and reading of a polyvinylidene-fluoride copolymer film suitably exposed to heating pulses and an applied electric field.

Yet another object is to provide for writing laser heating spots on a polyvinylidene-fluoride copolymer film at a first intensity in a predetermined electric field and reading the stored information of the spots with a polarized light at a lesser intensity in the absence of the electric field.

A further object is to provide for a long term storage of written information on a polyvinylidene-fluoride copolymer film and a subsequent erasure or rewriting without

DESCRIPTION OF THE PREFERRED EMBODIMENT

Figure 1:
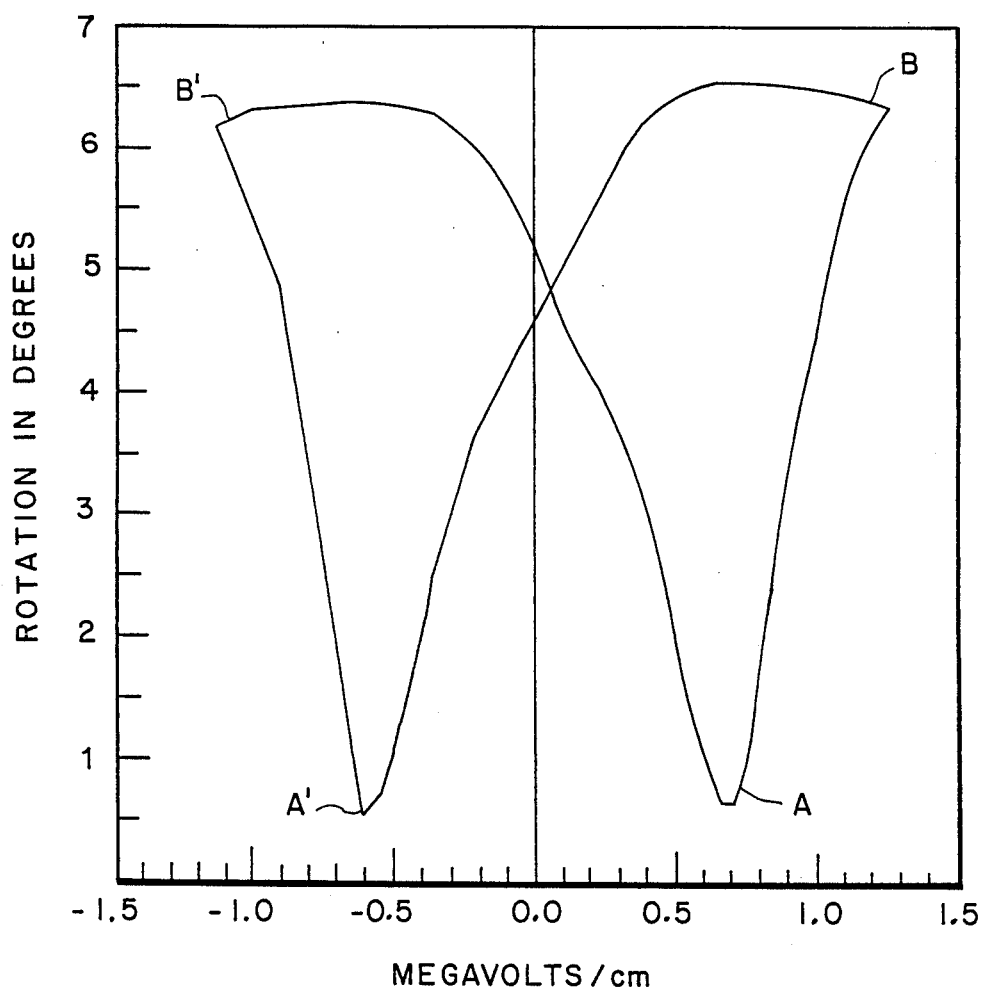
FIG. 1 is a graphical representation of the optical rotation of the direction of polarization of a linearly polarized beam of light passing through a polyvinylidene fluoride film with respect to the electric field across the material at a constant temperature.

The effect on which this inventive concept is based is the electro-optic analog of the magneto-optic effect referred to above. Polyvinylidene-fluoride, PVDF and some of its copolymers, such as polyvinylidene-fluoride-trifluoroethylene PVDF-TrFE can be considered ferroelectric in the sense that they can be given a remanent polarization which can be switched in a sufficiently high electric field sometimes referred to as a coercive field, see the article by A. J. Lovinger, *Science* 220 (1983) 1115. These materials have useful pyroelectric and piezoelectric properties that have been the object of intense interest over a number of recent years. In addition to the ferroelectric effects, PVDF also has optical properties that are not thoroughly understood. Among these are the second harmonic generation, see J. G. Bergman, J. H. McFee and G. R. Crane, *Applied Physics Letters* 18 (1971) 203, the electro-optical effects, note D. Broussoux and F. Micheron, *Journal of Applied Physics*, 51 (1980) 2020 and electro-optical hysteresis in polyvinylidene fluoride discussed by D. Gookin and R. Morris, *Applied Physics Letters* 45 (1984) 603.

It has been found that a longitudinal electro-optical effect is exhibited in ferroelectric materials that have an initial anisotropy in the refractive index in the plane of the film, see the article by C. E. Land and P. D. Thacher, *The Physics of Opto-Electronic Materials*, ed. W. A. Albers Jr. (Plenum Press, New York, 1971) 193. Longitudinal electro-optical effect refers, in this regard, to the phenomena occurring when the applied electric field and the direction of polarized reading light are the same as they pass through the PVDF film. A typical film of PVDF and its copolymers has an x and y axis defined to be in the plane of the film and a z axis perpendicular to the plane of the film. The dipole moment in PVDF and its copolymers is perpendicular to the polymer chains. The film is given an initial orientation by stretching or rolling the films, such that upon stretching, the polymer chains are given a preferential alignment parallel to the stretch direction. With the stretch direction taken to be the x axis, the molecular dipoles are preferentially aligned in the y-z plane and a large birefringence is induced in the x-y plane. When the polarization is switched between what will be regarded as the poled and unpoled state, a large change is created in one component of the index of refraction, $n_y$ and a relatively small change in the index of refraction $n_x$. From this it is apparent that the birefringence, $n_y - n_x$ is controllable by an externally applied electric field.

It has been noted that the coercive field, that being the externally applied electric field for changing PVDF polarization, decreases with increasing temperature. The Curie temperature (the temperature at which the anomalities that characterize a ferroelectric substance disappear) is lower than its melting point for some copolymers of PVDF. As a consequence, individual spots can be written upon by selective heating with a laser beam in the presence of an electric field. It is not necessary to bring the temperature of the heated spots above the Curie temperature to effect writing in the presence of the applied electric field. At room temperature a field slightly less than the coercive field will produce a negligible amount of polarization and, as a consequence, no optical rotation in the material is noted. When an individual spot is heated the coercive field at that point is reduced, the spot is poled, and has an observably different optical rotation at that point. The spots can be selectively erased as well by local heating to a temperature above the Curie temperature in the absence of the electric field. When the polarization is relaxed, the optical rotation returns to that of the depoled state.

For the purposes of demonstrating the longitudinal electro-optic effect, a 30 micron thick film of PVDF was held at constant temperature and was clamped between glass slides having transparent SnO contacts. An electric field was applied across the thickness of the sample and was varied at a frequency of 0.1 Hertz. FIG. 1 shows a plot of optical rotation versus electric field strength for the isothermic PVDF film irradiated at 0.6328 microns. Measurements of the optical rotation relative to electric field strength were provided using a birefringence measurement technique by H. Takasaki, N. Umeda and M. Tsukiji, in *Applied Optics* 19 (1980)

435 and in the article entitled "Electro-Optical Hysteresis In Polyvinylidene Fluouride" by D. Gookin and R. Morris, *Applied Physics Letters* 45 (6), Sept. 15 1984.

The shape of the plot is a loop in which optical rotation is shown as a function of applied electric field. This shape is different from the more familiar dielectric hysteresis loop because the changes in index of refraction are unaffected by inversion of the applied electric field. The point A on the curve represents the electrically depoled state. The point A' represents the electrically depoled state with the electric field reversed. Point B represents the fully poled state and B' represents the fully poled state with a reverse electric field. The optical rotation between the two states is about 6° to correspond to a specific rotational power of 2,000° per centimeter.

This value of the rotational power for PVDF may, at first, appear to be small when compared to the rotational power of the best magneto-optical storage materials. However, when the much greater transparency of PVDF is considered, the figure of merit for this material gains considerably. An expression for the figure of merit for optical storage materials is defined in the article by G. R. Knight in *Optical Information Processing* ed. S. H. Lee (Springer, Berlin, 1981) 166 and is expressed to be $2R/\alpha$ where R is the specific rotational power and $\alpha$ is the absorption coefficient. For the particular film used to demonstrate the electro-optic effects of this inventive concept, the figure of merit is 60° which compares very well with the figure of merit of the best magno-optical materials.

The area between point A and point B in FIG. 1 can also be said to represent variations in rotation of polarized light or modulations of the transmitted intensity through the PVDF film between cross-polarizing filters. These variations might be interpreted by appropriate detectors and the like as analog or digital information signals. All that remains is for a designer to appropriately rotate the dipoles in spots on the film to arrive at a storing of information. The presence or absence of the 6° rotation mentioned above was relied upon to indicate digital information. This writing and subsequent storage are effected by a novel application of a writing laser spot and an electric field less than the critical coercive field at room temperature.

Figure 2:
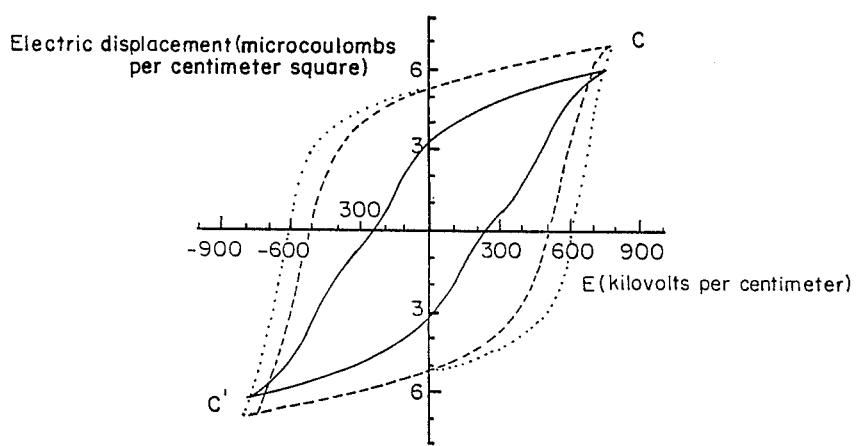
FIG. 2 shows dielectric hysteresis loops of a copolymer at 20° C., 40° C. and at 60° C.

Referring to FIG. 2, the critical field necessary to pole the sample decreases with increasing temperature. Poled states of the copolymer are depicted in the regions designated C and C' and the unpoled state is along the abscissa. The reduced field needed to change from the unpoled state to the poled state as the temperature is raised is demonstrated with temperatures of 20°, 40° and 60° C. Therefore, if a field slightly less than the critical field at an ambient temperature or room temperature is impressed across a PVDF film and the spot is heated locally with a focussed laser beam, the particular heated spot is poled without effecting or poling the rest of the sample. This procedure is essentially what happens when optical writing occurs in the PVDF-copolymer material. Since the Curie temperature is exceeding without melting the material, the individual spots are erased by once again heating locally with a focussed laser beam to a temperature greater than the material's Curie temperature. Erasure occurs however, in the absence of the applied field.

In other words, to have a writable, long term storage and erasable material the Curie temperature must be below the melting point. An acceptable material is a copolymer, poly(vinylidene-fluoride-trifluoroethylene), P(VDF-TrFE) which has Curie temperatures from 60° to 125° centigrade depending on the percentage of VDF. The article by T. Yamada and T. Kitayama appearing in *Journal of Applied Physics* 52 (1981) 6859 elaborates on this phenomena. The P(VDF-TrFE) copolymers have been shown to have ferroelectric properties similar to the PVDF homopolymer, see J. Ohwaki, H. Yamazaki and T. Kitayama's article *Journal of Applied Physics* 52 (1981) 6856. The dielectric hysteresis loops typically have as large or larger remanent and saturation polarizations and the coercive field decreases with increasing temperature which is a desirable property for optically writing on the material. These polymers have the property for retaining polarizations for periods of months or years and the largest structural features are the lamellae which have been observed to be less than 0.3 microns wide in thin P(VDF-TrFE) films. This observation was noted in the article by K. Kimura and H. Ohigashi, *Applied Physics Letters* 43 (1983) 834. The ferroelectric domain size can be expected to be much smaller such that a bit size of stored information is on the order of the defraction limit of visible light, about one micron.

Figure 3:
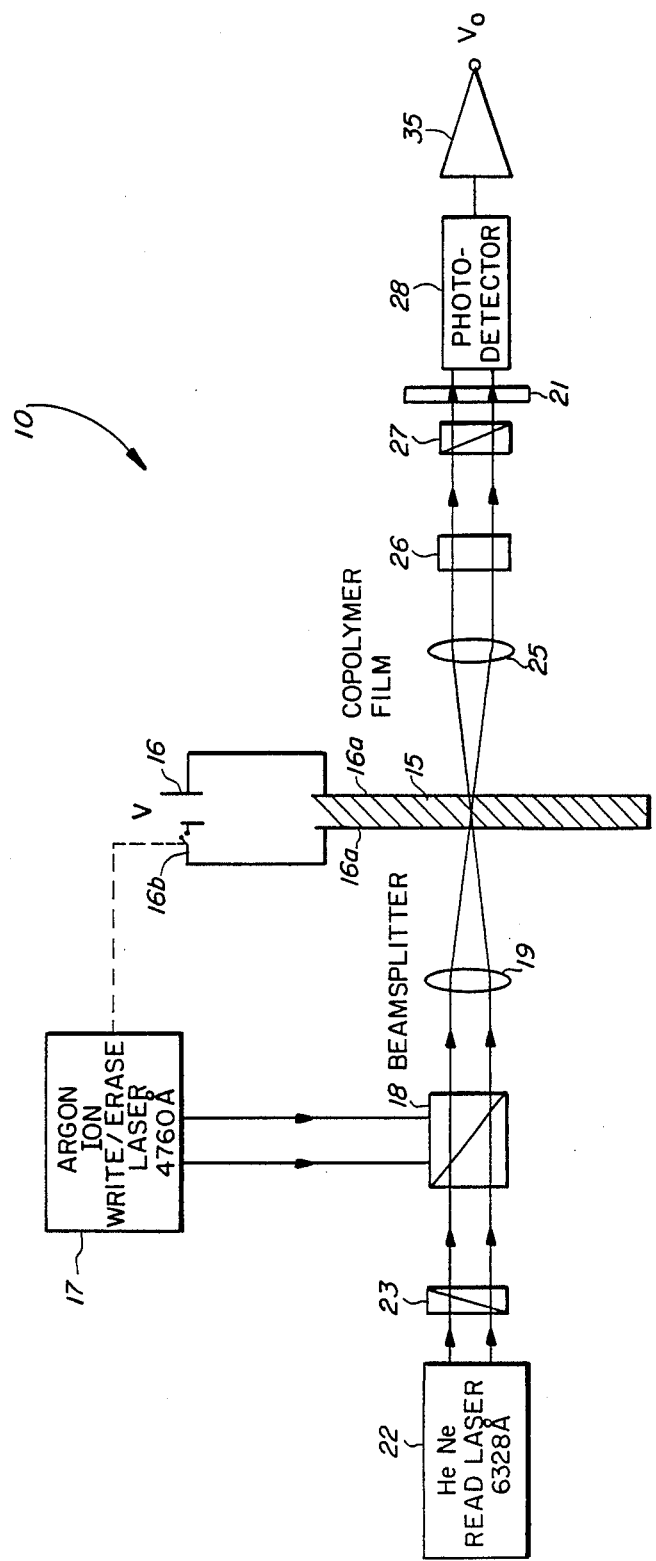
FIG. 3 sets forth a block diagram of the mechanism necessary for writing, reading and erasing information on this type of material.

Referring now to FIG. 3 of the drawings, an electro-optic system 10 is set out for writing, reading and erasing information on a thin polymer film 15. A potential source 16 impresses a field less than the critical field across polymer film 15 by suitable contacts 16a, for example, the SnO contacts mentioned above. The film is a P(VDF-TrFE) copolymer having one-tenth micron to one hundred micron thickness. A write/erase laser 17 is provided and is any one of a variety of commercially available units having the capability for being pulsed with sufficient power to heat spots on the polymer film to a temperature that is greater than the Curie temperature of the film. The writing laser selected may be Argon-Ion laser emitting 4760 Å light with a sufficient pulsed intensity to sufficiently heat spots of the copolymer film so that the electric field of applied potential 16 will pole the heated spots.

The writing beam from laser 17 passes through a beamsplitter 18 and onto the film via an appropriate lens 19. The beamsplitter is commercially available unit as well as the lens which focusses the writing spot into an area as little as one micron in diameter.

Although it is not shown in FIG. 3 to avoid needless cluttering of the drawings, a suitable translation or scanning arrangement could be provided which would either move the beam across the surface of the copolymer film or mechanically displace the film in two dimensions to effect complete information coverage of the film by successive spots representative of digital information.

The applied potential 16 is activated when the write laser is activated to heat spots on film 15. This assures that a heated spot is poled. When the heat from the writing laser is removed as the writing laser beam is scanned to the next spot or the film is moved, the spot cools and retains its poled condition. The writing operation as far as this spot is completed and the applied potential can be disconnected via a switch 16b. Since only during a writing operation is the information content on the polymer film 15 to be varied, potential source 16 and switch 16b are depicted as being operatively connected by the phantom line with operation of wire erase laser 17 during the writing operation. During erasure the potential source is not coupled across contacts 16a.

Interference filter 21 for the system is provided to protect other elements from the intensity of writing laser. The filter is designed to block the 4760 Å light energy from writing laser 17 but passes the reading energy at 6328 Å from read laser 22.

The read laser is a continuous wave unit for example, a HeNe laser radiating at 6328 Å. The output from this laser is less than that of writing laser 17 and is insufficient to heat spots on film 15. The function of the reading laser is to selectively illuminate the film with a reading scan to suitably actuate elements to be further described below.

The reading laser passes its reading beam through a polarizer 23 which passes polarized reading light at 6328 Å to beamsplitter 18. Part of the reading beam passes through beamsplitter 18 and through lens 19 and onto film 15 in a small diametered beam. The beam is rotated in accordance with the poled or unpoled spots on the film, passes through another lens 25 and compensator 26. The compensator is provided to compensate for the birefringence of the material of the film 15. A typical compensator includes two crystals that are mechanically tuned to reduce the effects of phase retardation. A Soleil-Babinet compensator widely available in the state-of-the-art is suitable.

An orthogonally disposed polarizer 27 receives the reading beam. Since polarizer 27 and polarizer 23 are orthogonal with respect to one another, no light will get through polarizer 27 when the compensator has been properly tuned. If, however, a spot has been poled, i.e. the dipoles rotated about 6° in this case, writing light will traverse polarizer 27 and reach a photodetector 28.

Photodetector 28 is selected from the state of the art to provide an output signal whenever 6328 Å light, in this case, falls on its photosensitive surface. Such is the case whenever a poled spot on film 15 rotates 6328 Å writing light coming from laser 22. Interference filter passes the 6328 Å light yet blocks pulses of 4760 Å light coming from writing and erase laser 17. Thus, the interference filter prevents higher energy bursts of light from laser 17 from damaging photodetector 28 as well as providing erroneous signals that might otherwise be produced when the write/erase laser is activated.

When an output signal is generated by photodetector 28, indicating the writing beam has been rotated by a poled spot, a suitably connected amplifier 35 produces an output signal $V_o$. If the spot on film 15 is not poled and the writing beam is blocked by the orthogonal polarizer 27, then no signal will be generated by photodetector 28 and amplifier 35 produces a zero voltage.

Obviously by changing the polarizers 23 and 27, the response of photodetector 28 and the response of amplifier 35 the output signal can be varied to reflect written poled or unpoled spots on film 15. The changes can be alone or in combination as are well known to one skilled in the art to which this invention pertains.

After a multitude of spot areas on film 15 have been written by write/erase laser 15 in accordance with information pulses as explained above, the film is a permanent record of the information content written therein. The spot size can be made small, to one micron in diameter, to assure a dense storage of information. Reading and rereading by read laser 23 and the components associated with differential amplifier 35 does not destroy or degrade the information content of film 15.

The electro-optic modification of the polarization of spots on the film affects the intensity of the light reaching photodetector 28. The transparency of the thin film assures an acceptable figure of merit that is comparable or exceeds current magneto-optic materials but unlike the current magneto optic materials, the information of the spots is permanent until they are erased in system 10.

Erasure occurs by appropriately placing the film to align it with the beam of writing/erase laser. This is accomplished by scanning and deflection circuits and apparatuses which are well known in the state of the art; they have not been graphically presented to avoid belaboring the obvious.

The write/erase laser is actuated and its beam heats the prerecorded spots. Since switch 16b is not closed, potential source 16 remains unconnected and there is no electric field across film 15. The pulses of energy heat the prerecorded spots on film 15 above the Curie temperatures of the material of film 15. The spots return to their unpoled state. The spots are erased.

Rewriting on the erased spots occurs when switch 16b is closed to reconnect source 16 across film 15. The electric field poles spots on the film that are heated via writing/erase laser 17. Turning off the writing/erasing laser and disconnecting the electric field creates another permanent record of information in the film by electro-optic means.

Figure 4:
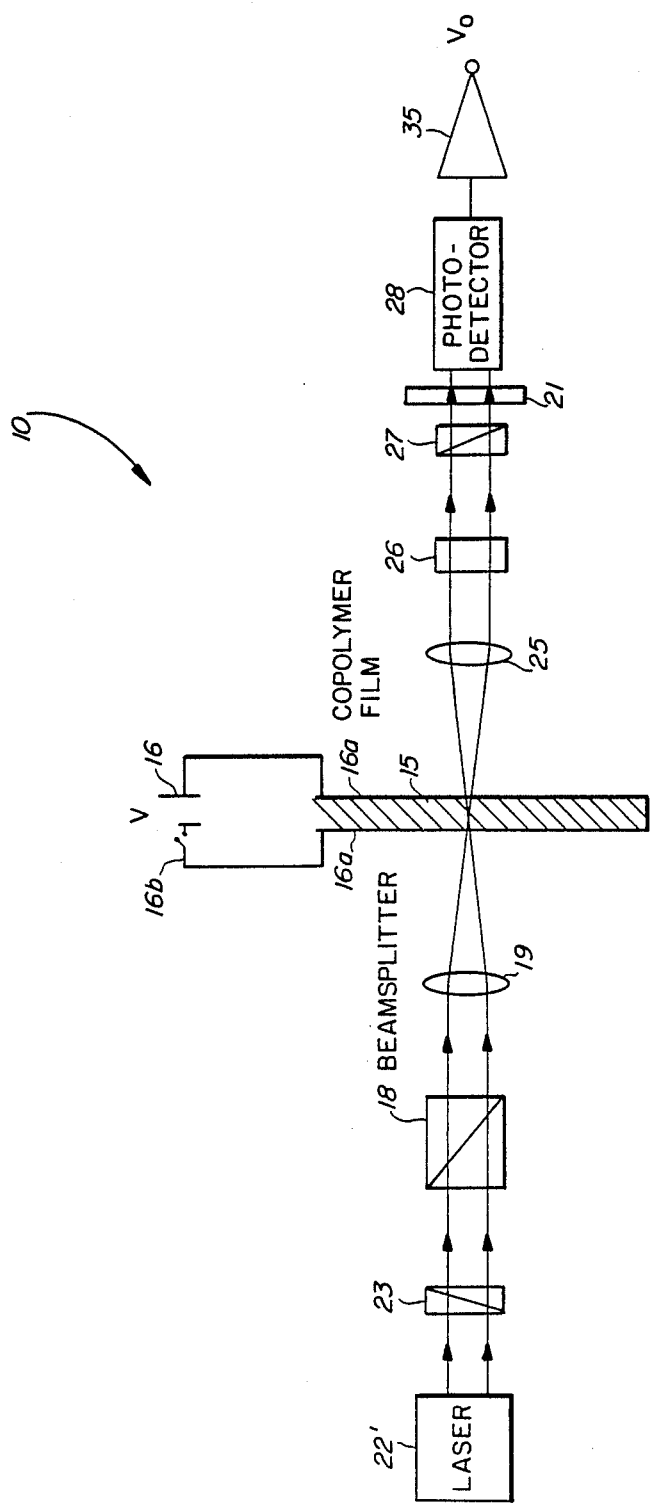
FIG. 4 shows an alternative embodiment using a single combination write/erase and read laser.

In the embodiment of FIG. 4, a single laser 22' has been substituted with the other elements being substantially the same. This preferably is a semiconductor laser operated to emit a single wavelength at different power levels.

When writing or erasing, laser 22' is actuated to be driven at a high enough level to heat the film sufficiently for writing and erasing as described above. When reading, the laser emits light at a lower level suitable for reading but insufficient to change the film's information content.

The copolymer disclosed herein is the only known material having the opto electronic writing, storage, reading and erase properties disclosed herein. Varying the percentages of the constituents of copolymers of P(VDF-TrFE) can be made within the scope of this inventive concept to arrive at results embraced herein.

Optical recording is greatly simplified using this ferroelectric polymer drawn into a thin film. The optical rotational power divided by the absorption coefficient of the material is its figure of merit and is significantly larger than that of the leading magneto-optical candidate materials. The chemical and physical stability of this material in repeated writing, reading and erasure has been demonstrated.

Doping of the film with a particular dye molecule causes the film to absorb light at the write wavelength yet be transparent at the read wavelength to improve system performance. Selection of the particular dye can be made by one skilled in the art knowing what the write and read wavelength are.

Obviously, many modifications and variations of the present invention are possible in the light of the above teachings. It is therefore to be understood that within the scope of the appended claims the invention may be practiced otherwise than as specifically described.

We claim:

1. An apparatus for optically writing, storing, reading and erasing digital information comprising:

a film of at least partially transparent poly(vinylidene-fluoride-trifluoroethylene) having a Curie temperature below its melting temperature;

means oriented to beam pulses of light onto the film for optically heating spots on the film;

means for impressing an electric field across the film having a magnitude less than the coercive field of the film at ambient temperature but of sufficient magnitude to rotate dipoles in the heated spots and thereby change the polarity of the heated spots to effect an optical writing therein;

means disposed for illuminating the polarity changed heated spots with polarized reading light, the illuminating means having a magnitude insufficient to heat the polarity changed spots above the film's Curie temperature, the polarized reading light having its polarization rotated where it passes through polarity changed heated spots;

means receiving the polarized reading light passing through the film for passing only the polarization rotated portions that traverse the polarity changed heated spots; and means responsive to the passed polarization rotated portions for generating signals representative of digital information.

2. An apparatus according to claim 1 in which the film is between one-tenth and one hundred microns thick and has a pair of nearly transparent electrodes disposed on opposite flat sides thereof.

3. An apparatus according to claim 2 in which the means of impressing includes a potential source connected by a switch to the transparent electrode on the film during the optical writing therein, the switch is actuated to disconnect the potential source from the electrodes during the erasing.

4. An apparatus according to claim 3 in which the optically heating means is a pulsed write/erase laser emitting write/erase pulses at a first wavelength having sufficient energy to heat the spots on the film to effect writing when the potential source is connected across the transparent electrodes and to effect erasure of the spots when the potential source is disconnected from the transparent electrodes.

5. An apparatus according to claim 4 in which the illuminating means is a reading laser emitting a continuous wave reading light at a second wavelength that is different from the first wavelength of the write/erase laser and a first polarizer passing the continuous wave reading light.

6. An apparatus according to claim 5 further including:
a beamsplitter disposed to receive the write/erase pulses from the write/erase laser and the polarized continuous wave reading light from the reading laser and
a lens located to receive the write/erase pulses and continuous polarized reading light from the beamsplitter to focus them on the film in a predetermined spot diameter.

7. An apparatus according to claim 6 in which the signal generating means includes a photodetector oriented to receive write/erase pulses and polarized continuous wave reading light that traverses the film, and an amplifier coupled to receive output from the photodetector.

8. An apparatus according to claim 7 in which the polarization rotated passing means is a second polarizer orthogonal to the first polarizer and including an interposed compensator.

9. An apparatus according to claim 7 further including:
an interference filter located to pass the continuous wave reading light and to block the write/erase pulses from the first photodetector.

10. An apparatus according to claim 1 in which the optically heating means and the illuminating means are combined in a single laser operated at a higher intensity to effect the writing and erasure of information and at a lower intensity to effect the reading of information.

11. A method for electro-optically writing, storing, reading and erasing comprising:
providing a one-tenth to one hundred micron thick transparent film of polyvinylidene-fluoride copolymer having a Curie temperature less than its melting temperature;
beaming optical energy pulses at discrete spots on the film, the energy of the pulses being sufficient to heat selective ones of the spots;
impressing an electric field across the film while the optical energy pulses are being beamed onto the spots, the electric field being less than the coercive field of the film at ambient temperature;
rotating the dipoles in the heated spots in the film as the heated spots are influenced by the electric field to write recorded information therein;
illuminating the rotated-dipole heated spots with polarized light having a magnitude less than that needed to raise the film above its Curie temperature;
compensating for the induced phase retardation caused by the inherent birefringence of the film;
polarizing the polarized light that passes through the film and the rotated dipole heated spots to blank the polarized light that passes only through the film;
detecting the polarized light that passes through the rotated dipole heated spots to read the recorded information therefrom.

12. A method according to claim 11 further including the steps of:
removing the electric field from the film and
rebeaming the optical energy pulses at the discrete spots on the film in the absence of the electric field to erase the information recorded therein.

13. A method according to claim 12 in which the step of beaming optical energy pulses includes the generation of optical pulses at a first wavelength and the step of illuminating includes the generation of an optical continuous wave at a second wavelength.

14. A method according to claim 13 in which the step of detecting includes the placing of a photodetector to receive the polarized light that passes through the rotated dipole heated spots and an amplifier connected to the photodetector for providing an output signal representative of recorded information.

15. A method according to claim 14 further including the steps of:
blocking the optical energy pulses from the photodetector to prevent the damage thereof and the erroneous generating of signals representative of recorded information and;
passing the illuminating polarized light to promote the generation of signals representative of recorded information.

16. A method according to claim 15 further including:

directing the optical energy pulses and illuminating polarized light through a common beamsplitter to provide a partial common path through the film toward the photodetector.

17. An apparatus for optically writing, storing, reading and erasing digital information comprising:

a film of at least partially transparent ferroelectric polymer having a Curie temperature below its melting temperature;

means oriented to beam pulses of light onto the film for optically heating spots on the film;

means for impressing an electric field across the film having a magnitude less than the coercive field of the film at ambient temperature but of sufficient magnitude to rotate dipoles in the heated spots and thereby change the polarity of the heated spots to effect an optical writing therein;

means disposed for illuminating the polarity changed heated spots with polarized reading light, the illuminating means having a magnitude insufficient to heat the polarity changed spots above the film's Curie temperature, the polarized reading light having its polarization rotated where it passes through polarity changed heated spots;

means receiving the polarized reading light passing through the film for passing only the polarization rotated portions that traverse the polarity changed heated spots; and means responsive to the passed polarization rotated portions for generating signals representative of digital information.

* * * * *